(12) United States Patent
Lu et al.

(10) Patent No.: US 10,878,756 B1
(45) Date of Patent: Dec. 29, 2020

(54) TFT PIXEL THRESHOLD VOLTAGE COMPENSATION CIRCUIT WITH SHORT DATA PROGRAMMING TIME AND LOW FRAME RATE

(71) Applicant: Sharp Kabushiki Kaisha, Osaka (JP)

(72) Inventors: Tong Lu, Oxford (GB); Michael James Brownlow, Oxford (GB); Tim Michael Smeeton, Oxford (GB)

(73) Assignee: Sharp Kabushiki Kaisha, Osaka (JP)

( * ) Notice: Subject to any disclaimer, the term of this patent is extended or adjusted under 35 U.S.C. 154(b) by 21 days.

(21) Appl. No.: 16/515,370

(22) Filed: Jul. 18, 2019

(51) Int. Cl.
  *G09G 3/3258* (2016.01)
  *G09G 3/3291* (2016.01)
  *G09G 3/3266* (2016.01)
  *H01L 51/00* (2006.01)

(52) U.S. Cl.
  CPC ......... *G09G 3/3258* (2013.01); *G09G 3/3266* (2013.01); *G09G 3/3291* (2013.01); *G09G 2310/0216* (2013.01); *H01L 51/0082* (2013.01); *H01L 2251/308* (2013.01)

(58) Field of Classification Search
  None
  See application file for complete search history.

(56) References Cited

U.S. PATENT DOCUMENTS

| | | | |
|---|---|---|---|
| 7,414,599 B2 | 8/2008 | Chung et al. |
| 8,830,219 B2 | 9/2014 | Choi et al. |
| 9,214,506 B2 | 12/2015 | Xie |
| 9,761,172 B2 | 9/2017 | Ryu |
| 9,812,066 B2 | 11/2017 | Kim et al. |
| 10,134,329 B2 | 11/2018 | Han |
| 2016/0203759 A1 | 7/2016 | Han |

*Primary Examiner* — Aneeta Yodichkas
(74) *Attorney, Agent, or Firm* — Renner, Otto, Boisselle & Sklar, LLP

(57) ABSTRACT

A pixel circuit is operable in initialization, data programming, threshold compensation, and emission phases. The pixel circuit includes a drive transistor configured to control an amount of current to a light-emitting device during the emission phase depending upon a voltage applied to a gate of the drive transistor. A first ultra-low leakage oxide transistor is employed as a data switch device, and the data voltage is applied to the gate of the drive transistor through the first ultra-low leakage oxide transistor during the data programming phase. A second ultra-low leakage oxide transistor is employed as an initialization switch device. The second ultra-low leakage oxide transistor is in an on state during the initialization, data programming, and threshold compensation phases, and the initialization voltage is applied to the gate of the drive transistor through the second ultra-low leakage oxide transistor during the initialization phase.

20 Claims, 7 Drawing Sheets

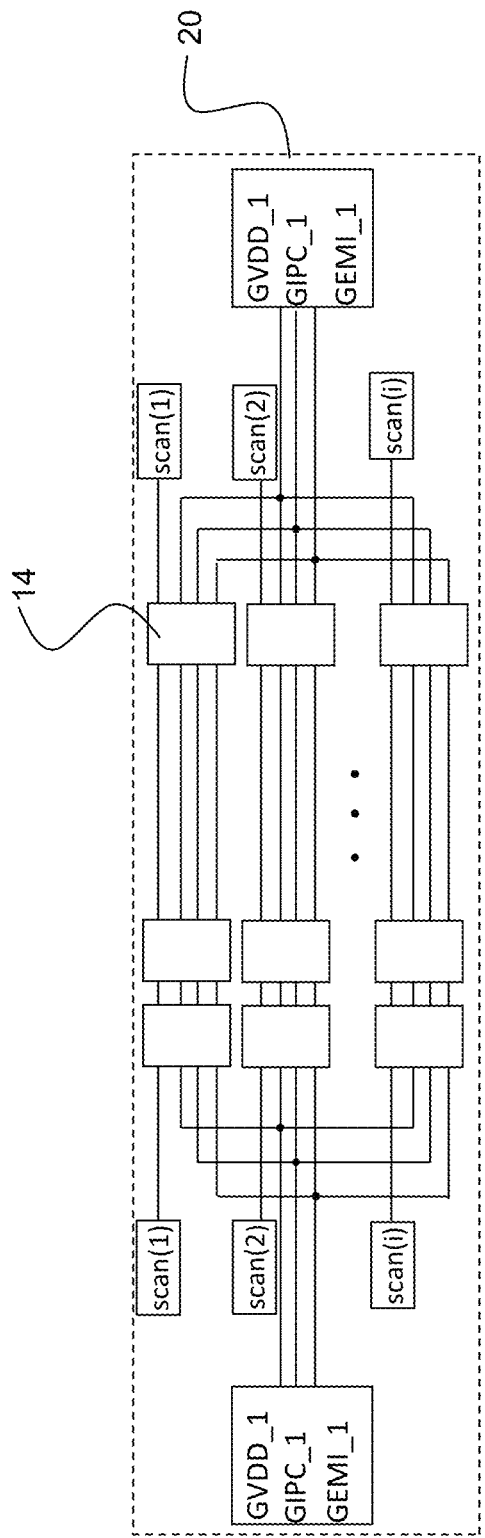

TFT PIXEL THRESHOLD VOLTAGE COMPENSATION CIRCUIT WITH SHORT DATA PROGRAMMING TIME AND LOW FRAME RATE

TECHNICAL FIELD

The present invention relates to design and operation of electronic circuits for delivering electrical current to an element in a display device, such as for example to an organic light-emitting diode (OLED) in the pixel of an active matrix OLED (AMOLED) display device.

BACKGROUND ART

Organic light-emitting diodes (OLED) generate light by re-combination of electrons and holes, and emit light when a bias is applied between the anode and cathode such that an electrical current passes between them. The brightness of the light is related to the amount of the current. If there is no current, there will be no light emission, so OLED technology is a type of technology capable of absolute blacks and achieving almost "infinite" contrast ratio between pixels when used in display applications.

Several approaches are taught in the prior art for pixel thin film transistor (TFT) circuits to deliver current to an element of a display device, such as for example an organic light-emitting diode (OLED), through an n-type drive transistor. In one example, an input signal, such as a "SCAN" signal, is employed to switch transistors in the circuit to permit a data voltage, VDAT, to be stored at a storage capacitor during a programming phase. When the SCAN signal is low and the switch transistors isolate the circuit from the data voltage, the VDAT voltage is retained by the capacitor and this voltage is applied to a gate of a drive transistor. With the drive transistor having a threshold voltage $V_{TH}$, the amount of current to the OLED is related to the voltage on the gate of the drive transistor by:

$$I_{OLED} = \frac{\beta}{2}(V_{DAT} - V_{OLED} - V_{TH})^2$$

where $V_{OLED}$ is a voltage between the anode of the OLED and an ELVSS power supply.

TFT device characteristics, especially the TFT threshold voltage $V_{TH}$, may vary with time or among comparable devices, for example due to manufacturing processes or stress and aging of the TFT device over the course of operation. With the same VDAT voltage, therefore, the amount of current delivered by the drive TFT could vary by a large amount due to such threshold voltage variations. Therefore, pixels in a display may not exhibit uniform brightness for a given VDAT value.

Conventionally, therefore, OLED pixel circuits have high tolerance ranges to variations in threshold voltage and/or carrier mobility of the drive transistor by employing circuits that compensate for mismatch in the properties of the drive transistors. For example, an approach is described in U.S. Pat. No. 7,414,599 (Chung et al., issued Aug. 19, 2008), which describes a circuit in which the drive TFT is configured to be a diode-connected device during a programming period, and a data voltage is applied to the source of the drive transistor.

The threshold compensation time is decided by the drive transistor's characteristics, which may require a long compensation time for high compensation accuracy. For the data programming time, the RC constant time required for charging the programming capacitor is determinative of the programming time. As is denoted in the art, the one horizontal (1H) time is the time that it takes for the data to be programmed for one row.

With such a circuit configuration as in U.S. Pat. No. 7,414,599, the data is programmed at the same time as when the threshold voltage of the drive transistor is compensated. It is desirable, however, to have as short of a one horizontal time as possible to enhance the responsiveness and operation of the display device. This is because each row must be programmed independently, whereas other operations, such as for example drive transistor compensation, may be performed for multiple rows simultaneously. The responsiveness of the display device, therefore, tends to be dictated most by the one horizontal time for data programming. When the data is programmed during the same operational phase as the drive transistor is compensated, the one horizontal time cannot be reduced further due to compensation accuracy requirements for the drive transistor, as the compensation requirements limit any time reductions for the programming phase. A different approach needs to be employed to have a short one horizontal time.

As well as fast response time, a display device sometimes shows a static image such as a screen saver, logo, or the like. When displaying such a static image, often such image needs to be displayed or retained for a substantially longer period of time as compared to a dynamic image. For saving power consumption, especially as to a battery powered device such as a mobile communication device or other portable computing device, it may desirable to have a lower frame refresh rate. Oxide thin film transistors, such as IGZO (indium gallium zinc oxide) transistors, have ultra-low leakage when in the off state. When using an IGZO transistor as a data switch, the leakage through the data switch is ultra-low, and thus the switch can retain the data voltage at the gate of the drive transistor for a very long time. With using an IGZO transistor as the data switch, the frame refresh rate can be reduced to save power consumption.

A global compensation scheme, whereby an entire display panel of pixels can be compensated simultaneously, can be used to separate drive transistor compensation from data programming. With a global compensation scheme, all the pixels in the display panel are compensated at the same time. Compared to a conventional row-by-row compensation scan, the control signals for a global compensation scheme are the same for each of the rows being compensated simultaneously. The use of a global compensation scheme simplifies the panel driver design and saves power consumption for the logic generation circuits.

One approach for a global compensation scheme in described in U.S. Pat. No. 8,830,219 (Choi, issued Sep. 9, 2009). In such circuit, two global control signals and a power supply ELVDD change to a state resetting all the pixels in the panel. Then the data is programmed row by row to each pixel, and global threshold compensation follows the row-by-row data programming. After global compensation, the global control signals enable the emission for all the pixels in the panel. A short one horizontal time can be achieved as the programming time is independent of the compensation time, but this scheme has a compensation mismatch between rows as the compensation time is different for each row. In particular, the first row has the longest compensation time and the last row has the shortest compensation time, and this variation can result in latter rows being inadequately compensated.

Another global compensation approach is described in US 2016/0203759 (Han, published Jul. 14, 2016). In such configuration, data is pre-loaded to a hold capacitor in each pixel row by row by a scan signal. After the data is loaded on all the rows, a global reset signal is applied to all the pixels, and the data stored on the hold capacitor is applied to the gate of the drive transistor in each pixel by a global writing signal. During the same time, the difference between the data voltage and the threshold voltage of drive transistor is obtained at the source of the drive transistor and stored in a storage capacitor. Then the stored voltage is applied to the gate and source of the drive transistor during the emission phase. In this way the data voltage is programmed to the pixel and the threshold voltage of the drive transistor is compensated. The data holding time on the hold capacitor can be as long as the emission time, but the described configuration does not recognize issues associated with off-state transistor leakage. Accordingly, leakage through the described TFT components could degrade the data voltage on the hold capacitor over time. As a result, the same data voltage stored on the hold capacitors for the first row and last row could have a significant difference due to the leakage. A second issue with this scheme is the timing of the global signals, especially the voltage supplies ELVDD and ELVSS. There could be a large surging current at the supply lines when the signals for all the pixels change at the same time, and this large surge current could cause a large IR drop which undermines performance.

To overcome the drawbacks with conventional global compensation, a group compensation can be employed, whereby a number of rows of pixels is controlled by group signals, and the threshold voltage variations are compensated for a number of rows of pixels, short of the entire display panel. A group compensation approach is described in U.S. Pat. No. 9,812,066 (Kim, issued Nov. 7, 2017). The pixel rows on the panel are divided into a number of pixel groups, with each group having the same number of pixel rows. Threshold voltage is compensated for each group of pixel rows with the same group control signals. The data is programmed after the threshold compensation while the threshold compensation is performed for the next group of pixel rows. As the number of rows in a group is limited, the current surges on the voltage supplies are also limited, but this scheme has shortcomings. For example, the number of transistors in the pixel configuration of U.S. Pat. No. 9,812,066 is seven, which occupies a large area and may not suitable for high-resolution applications. In addition, the data stream for each group is preceded by a reference signal for threshold compensation, which increases the effective one horizontal time.

SUMMARY OF INVENTION

The present invention relates to pixel circuits that are capable of compensating the threshold voltage variations of the drive transistor with an ultra-short one horizontal time 1H of less than about 2 µs, which is shorter as compared to conventional configurations, with additionally removing the possible memory effects associated with the light-emitting device and the drive transistor from the previous frame. An ultra-short 1H time (<2 µs) is achieved via separation of threshold compensation of the drive transistor and data programming phases. The threshold compensation time is decided by the drive transistor characteristics and is difficult to reduce further without degrading the compensation accuracy. By separating the threshold compensation and data programming phases, a longer time can be allocated to threshold compensation for compensation accuracy while maintaining a short 1H time. As referenced above, the RC constant time required for charging the programming capacitor is determinative of the programming time, and such programming time can be reduced to ultra-short 1H times (<2 µs).

To achieve such results, a two-capacitor pixel circuit configuration is used, whereby a first capacitor is used for drive transistor threshold compensation, and a second capacitor is used to store the data voltage. The threshold compensation and data programming operations are independent of each other, and thus a short one horizontal time can be achieved by employing a short data programming phase.

Embodiments of the present application also use an ultra-low leakage oxide transistor, such as an IGZO transistor, as the data switch device, and this permits the stored data voltage to be retained longer on the second capacitor due to ultra-low leakage of the IGZO device. A conventional typical refresh rate is 60 Hz. By using an IGZO device as the data switch transistor, the refresh rate can be reduced to 30 Hz or lower for static images. With a lower refresh rate, the power consumption in turn is reduced.

Embodiments of the present application may be operated using a group compensation scheme, whereby multiple rows of pixels are controlled by group signals, and the threshold voltage variations of the drive transistors are compensated for pixels in each of the rows in the same group simultaneously. Further power saving is achieved by the group compensation scheme.

An aspect of the invention, therefore, is a pixel circuit for a display device that employs a two capacitor configuration and an ultra-low leakage data switch transistor to isolate the data programming phase from the compensation phase, thereby enable a shorter 1H time as compared to conventional configurations, and further permitting a reduced refresh rate. The pixel circuit is operable in an initialization phase, a data programming phase, a threshold compensation phase, and an emission phase.

In exemplary embodiments, the pixel circuit includes a drive transistor configured to control an amount of current to a light-emitting device during the emission phase depending upon a voltage applied to a gate of the drive transistor, wherein a threshold voltage of the drive transistor is compensated during the threshold compensation phase, and a first terminal of the drive transistor is connected to a first power supply; wherein the light-emitting device is electrically connected at a first node to a second terminal of the drive transistor during the emission phase, and at a second node to a second power supply; a first ultra-low leakage oxide transistor connected between the gate of the drive transistor and a data voltage input line that supplies a data voltage, wherein the data voltage is applied to the gate of the drive transistor through the first ultra-low leakage oxide transistor during the data programming phase; and a second ultra-low leakage oxide transistor connected between a node N1 and an initialization voltage input line that supplies an initialization voltage, the second ultra-low leakage oxide transistor being in an on state during the initialization, data programming, and threshold compensation phases, and the initialization voltage is applied to the gate of the drive transistor through the second ultra-low leakage oxide transistor during the initialization phase.

The pixel circuit further may include a first capacitor having a first plate connected to the node N1 and a second plate connected to the second terminal of the drive transistor; and a second capacitor having a first plate connected to the gate of the drive transistor and a second plate connected to the node N1, wherein the first plate of the second capacitor stores the data voltage during the data programming and threshold compensation phases. The pixel circuit further may include a second transistor connected between the gate of the drive transistor and the node N1, wherein the initialization voltage is applied to the gate of the drive transistor through the second transistor during the initialization phase. The pixel circuit further may include a third transistor connected between the second terminal of the drive transistor and the first node of the light-emitting device, wherein the first node of the light-emitting device is electrically connected to the second terminal of the drive transistor through the third transistor during the emission phase. The first and/or second ultra-low leakage oxide transistors are indium gallium zinc oxide transistors.

Individual pixel circuits may be incorporated into a display panel that includes a pixel array comprising a plurality of individual pixels arranged in "n" rows by "m" columns, and "n" and "m" are integers greater than one, wherein each of the individual pixels in the pixel array is configured according to any of the embodiments. The pixel array is arranged in "n/i" pixel groups wherein "i" is the number of rows of individual pixels in each pixel group. The pixels may be controlled in accordance with a group compensation scheme in which group control signals and a group power supply are applied to each of the pixels within a respective group simultaneously.

Another aspect of the invention is a method of operating a pixel circuit according to any of the embodiments, whereby component variations are compensated within a short 1H time. In exemplary embodiments, the method of operating includes the steps of providing a pixel circuit according to any of the embodiments; performing an initialization phase comprising: changing a voltage level of the first power supply from a higher value to a lower value at the beginning of the initialization phase to initialize a voltage level at the second terminal of the drive transistor and the first node of the light-emitting device, placing the second ultra-low leakage oxide transistor in an on state to apply an initialization voltage to the gate of the drive transistor through the second ultra-low leakage oxide transistor, and at the end of the initialization phase, disconnecting the source of the drive transistor from the first node of the light-emitting device; performing a data programming phase to program the data voltage by electrically connecting the data voltage input line to the gate of the drive transistor through the first ultra-low leakage oxide transistor, and applying the data voltage to the gate of the drive transistor; performing a threshold compensation phase to compensate a threshold voltage of the drive transistor by changing the first power supply from the lower value to the higher value while the second ultra-low leakage oxide transistor is in the on state; and performing an emission phase during which light is emitted from the light-emitting device by electrically connecting the second terminal of the drive transistor to the first node of the light emitting device while the first and second ultra-low leakage oxide transistors are in the off state.

In a group compensation scheme, the first power supply is a group power supply that supplies voltage to all pixels within a respective group, and the voltage level of the group power supply changes from the higher value to the lower value at beginning of the initialisation phase and changes to the higher value at the end of the data programming phase. Gates of the first ultra-low leakage oxide transistor of each of the individual pixel circuits are is connected to a SCAN control signal line that supplies a SCAN control signal that controls a state of the first ultra-low leakage oxide transistor, wherein the data programming phase includes sequentially enabling the SCAN signal to the pixel array row by row without disruption from the first row to the nth row. Gates of the second ultra-low leakage oxide transistors in each pixel group are connected to a common group control signal GIPC that controls a state of the second ultra-low leakage oxide transistors of the respective group to apply the initialization voltage To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF DRAWINGS

FIGS. 2A and 2B are drawings depicting more closeup views of portions of the display panel of FIG. 1 showing groups of pixels controlled by common group control signals.

DESCRIPTION OF EMBODIMENTS

Figure 1:
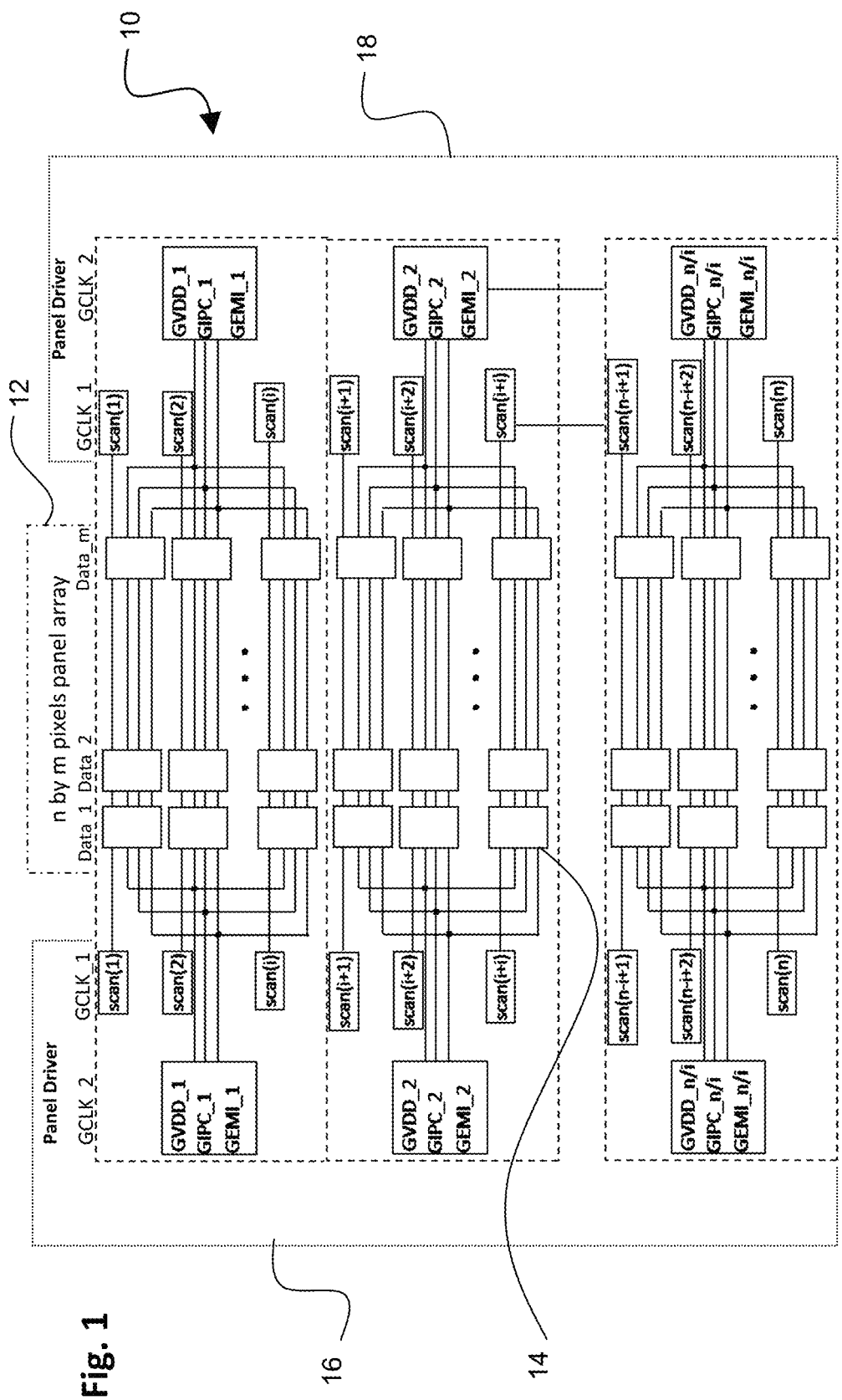
FIG. 1 is a drawing depicting a display panel with "n" rows and "m" columns of individual pixels, and a panel driver configuration that operates using a group compensation scheme.

Embodiments of the present invention will now be described with reference to the drawings, wherein like reference numerals are used to refer to like elements throughout. It will be understood that the figures are not necessarily to scale.

FIG. 1 is a drawing depicting a display panel configuration 10 in accordance with embodiments of the present application. The display panel 10 includes a pixel array 12 of "n" rows and "m" columns of individual pixels 14, and panel drivers 16 and 18 located respectively on the left and right edges of the display panel 10 on opposite sides of the pixel array 12. The panel drivers 16 and 18 operate comparably as each other in applying comparable control signals as further detailed below. Multiple panel drivers are used to prevent signal degradation across the display panel, and applying control signals from panel drivers on opposite sides of the pixel array 12 ensures effective control signals are received by the individual pixels regardless of location on the display panel.

Each individual pixel 14 is located at the intersection of scan control lines and the data input lines. The data input lines are arranged by column, i.e., there are "m" columns data input lines (Data_1, Data_2, . . . Data_m) associated with a corresponding "m" data signals that respectively are connected to the pixels in each column via one data line. The scan control lines are arranged by row, i.e., there are "n" rows of scan control lines (scan(1), scan(2), . . . scan(n)) associated with a corresponding "n" scan control signals that respectively are connected to the pixels in each row via one scan control line. The scan control signals perform a row selection function, whereby when a scan line in a row is enabled, the data is written to the pixels in that row.

Figure 2B:
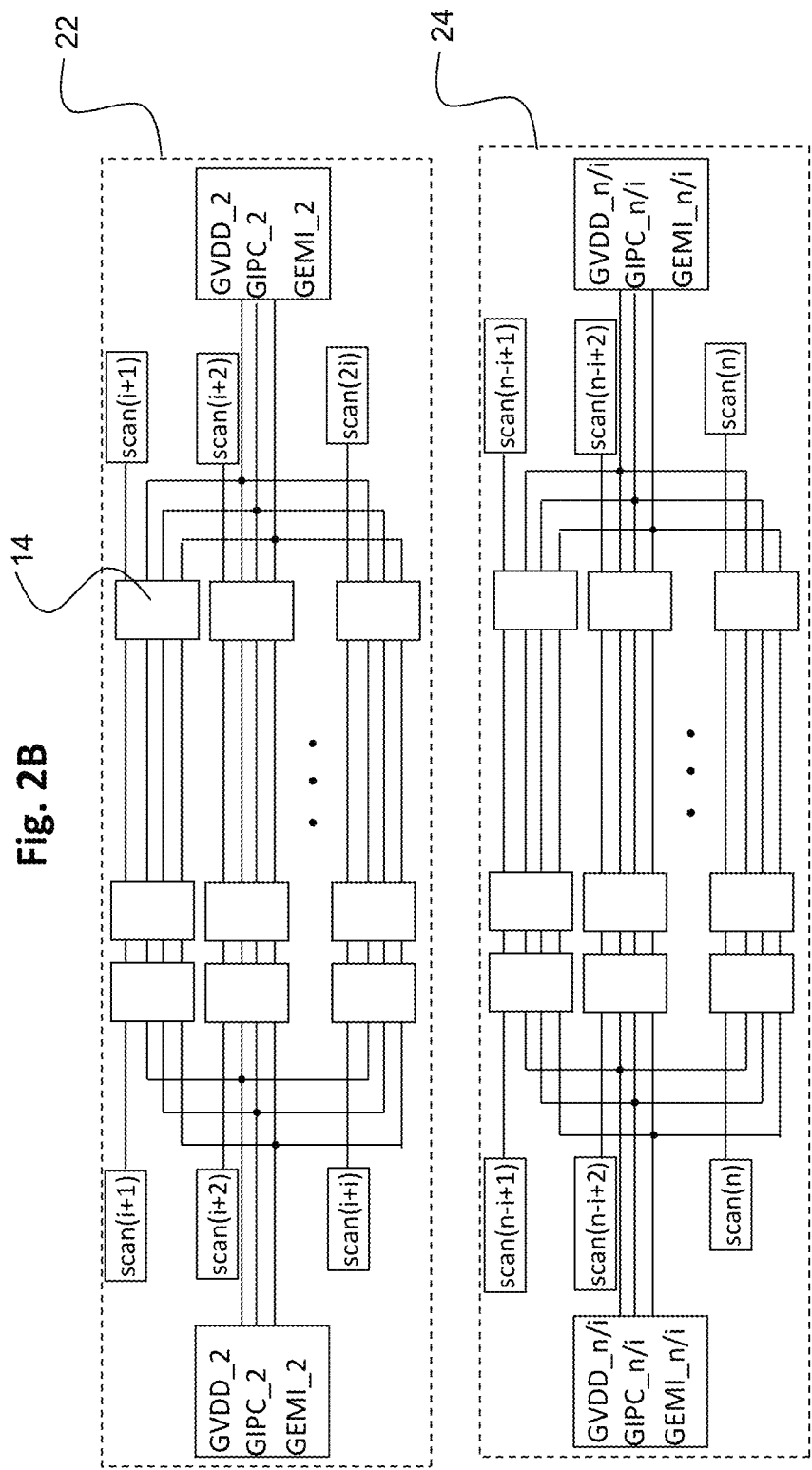

Referring to the panel drivers 16 and 18, the pixels in each row are also connected to two controls lines, GIPC and GEMI, and one positive power supply, GVDD, configured to implement a group compensation scheme. FIGS. 2A and 2B are drawings depicting more closeup views of portions of the display panel of FIG. 1 with the scan and data lines removed so as to provide an enhanced view of group control aspects of the configuration. The pre-letter "G" denotes a group control signal or group power supply input that spans multiple rows of pixels. FIGS. 2A and 2B are considered together, and are spit onto different drawings pages for better visibility of the pixel group features. Accordingly, FIG. 2A depicts a first group 20 of pixel rows, and FIG. 2B depicts a second group 22 of pixel rows and an "n/i"th group 24 of pixel rows. In the depicted example, therefore, each pixel group 20, 22, 24 includes "i" rows of pixels, and there are a total of n/i groups where "n" again is the total number of pixel rows. The precise number of total rows "n" and rows per group "i" may be configured as suitable for any particular display application.

The various control signal input lines are used to operate the individual pixels 14 in different phases. Generally, the pixels are operated in four phases, including an initialization phase, a data programming phase, a threshold compensation phase, and an emission phase. As further detailed below (in connection with FIGS. 5 and 6), GIPC signals are enabled during a second part of initialization phase, the data programming phase, and the threshold compensation phase. GEMI signals are enabled during the initialization phase and the emission phase. The group power supply, GVDD, is used to supply the current to the light-emitting device during the emission phase. The group power supply GVDD also is used to initialize the individual pixel circuits and to enable the threshold compensation with voltage level changes. The pixel circuit control during each phase is described in more detail below. The individual pixel circuits in each group of "i" rows share the same group control signal input lines, GIPC and GEMI, and the group power supply GVDD. The GIPC, GEMI and GVDD signals may be collectively referred to as "group control signals" in the present application.

Figure 3:
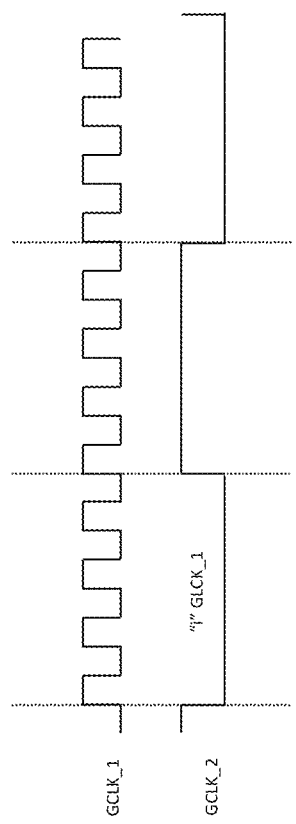
FIG. 3 is a drawing depicting a timing diagram of gate clocks for each row and each group of pixels of the display panel of FIG. 1.

Referring back to FIG. 1, a first gate clock signal input line, GCLK_1, from a driver integrated circuit (IC) is input to the panel drivers 16 and 18. The first gate clock signal is used to generate the scan signals for each row. A second gate clock signal input line, GCLK_2, from the driver IC also is input to panel drivers 16 and 18. The second gate clock signal is used to generate the GIPC and GEMI control signals and the GVDD power supply control signals for each pixel group. FIG. 3 is a drawing depicting a timing diagram of the gate clocks for each row and each group of pixels of the display panel of FIG. 1. FIG. 3 shows the timing of the first gate clock, GCLK_1, and the second gate clock, GCLK_2. The frequency of the second gate clock is one "i"th of the frequency of the first gate clock when the number of rows in one group is "i":

$$f_{GCLK\_2} = \frac{f_{GCLK\_1}}{i}$$

In this manner, the clock signals are timed for appropriate row-by-row scanning for data programming, with simultaneous group compensation of the drive transistors of pixels within each group.

Figure 4:
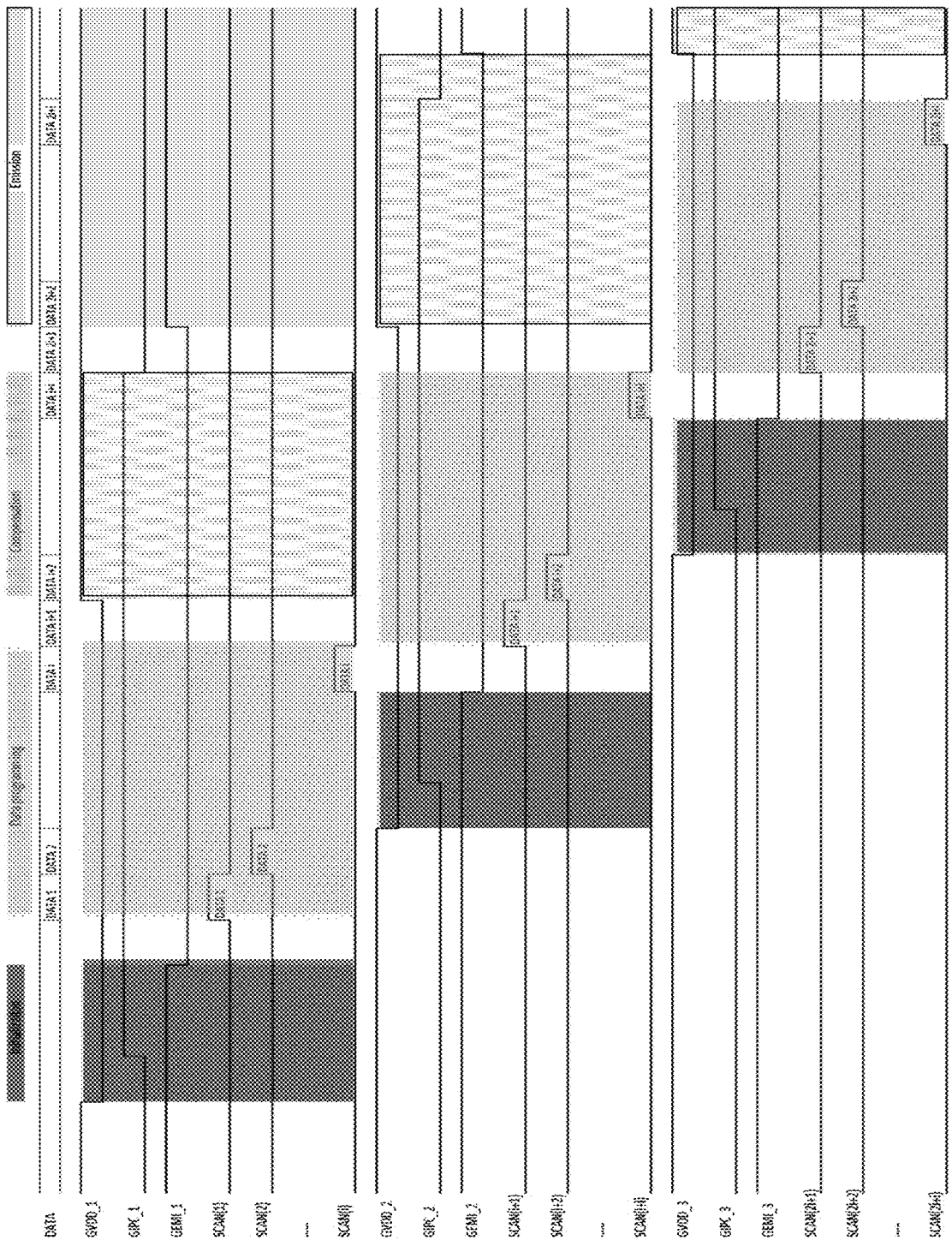
FIG. 4 is a timing diagram for group compensation that is employed in the display panel of FIG. 1.

FIG. 4 is a timing diagram for group compensation that is employed in the pixel panel of FIG. 1. As representative, the timing diagram of FIG. 4 illustrates the scan signals SCAN, group control signals GIPC and GEMI, and group power supply inputs GVDD of the first three pixel groups in the panel. "DATA" is the data signal that is applied to the pixel columns, and FIG. 4 shows timing for only one column data signal. In the whole panel, there are "m" columns of data signals applied respectively to the "m" columns" of pixels. "GVDD_1" is a group power supply for a first group rows, "GVDD_2" is a group power supply for a second group rows, and "GVDD_3" is a group power supply for a third group rows, and so on until the last group rows. "GIPC_1" is a group control signal for the first group rows, "GIPC_2" is a group control signal for the second group rows, and "GIPC_3" is a group control signal for the third group rows, and so on until the last group rows. "GEMI_1" is a group emission control signal for the first group rows, "GEMI_2" is a second group emission control signal for the second group rows, and "GEMI_3" is a group emission control signal for the third group rows, and so on until the last group rows. "SCAN (1)" is the scan signal for the first row in the first group rows, "SCAN (2)" is the scan signal for the second row in the first group rows, and "SCAN (i)" is the scan signal for an "i" th row or last row in the first group rows. "SCAN (i+1)" is the scan signal for the first row in the second group rows, "SCAN (i+2)" is the scan signal for the second row in the second group rows, and "SCAN (i+i)" is the scan signal for the "i" th row or last row in the second group rows. "SCAN (2i+1)" is the scan signal for the first row in the third group rows, "SCAN (2i+2)" is the scan signal for the second row in the third group rows, and "SCAN (2i+i)" is the scan signal for the "i" th row or last row in the third group rows, and so on for all groups of rows of the display panel.

As illustrated in FIG. 4, GVDD_1 changes from a high voltage value to a low voltage value and starts the initialization phase for the first group of "i" rows. GIPC_1 changes from a low voltage value to a high voltage value during the initialization phase. GEMI next changes from a high voltage value to a low voltage value, which ends the initialization phase and starts the data programming phase. SCAN(1) changes from a low voltage value to a high voltage value, and the DATA line for the column writes the DATA voltage to the pixel at the first row of the column. SCAN(1) then changes from the high voltage value to the low voltage value, and the DATA is stored at the first row. SCAN(2) then enables the DATA to be written and stored at the second row, and so on until the DATA for the ith (last) row of the first group rows is written and stored. The data programming phase for the first group rows thus ends. GVDD_1 next changes from the low voltage value to the high voltage value and starts the threshold compensation phase for the first group rows. GIPC_1 next changes from the high voltage value to the low voltage value and ends the threshold compensation phase for the first group rows. GEMI next changes from the low voltage value to the high voltage value and starts the emission phase, during which the light-emitting device such as an OLED emits light.

In the group compensation scheme, the phases of the different groups of rows are staggered in a manner by which different phases occur simultaneously in different row groups. This increases the efficiency of the display response. For example, as illustrated in FIG. 4, during the data programming phase for the first group rows, the initialization phase for the second group rows occurs. The timing of the start of initialization phase is to align the data scan signals such that the first row of the second group starts the data programming just after the last row of the first group finishes the data programming. In this way, the data stream continues from the first row to the last row of the panel, and there is no disruption of data programming between the group rows. The second group rows operate in the initialization phase, data programming phase, threshold compensation phase, and emission phase in comparable sequence as the first group rows, with the third group rows performing the initialization phase during performance of the compensation phase of the second group rows, and so on until the last group rows completes the sequence of phases.

In accordance with embodiments of the present application, an enhanced pixel circuit configuration is provided the enables efficient operation within the group compensation and control scheme described above. In other words, the described individual pixel circuit may be incorporated into each of the individual pixels 14 of the display panel 10. The individual pixel circuit is capable of compensating the threshold voltage variations of the drive transistor with an ultra-short one horizontal time 1H of less than about 2 μs, which is shorter as compared to conventional configurations, with additionally removing the possible memory effects associated with the light-emitting device and drive transistor from the previous frame. An ultra-short 1H time (<2 μs) is achieved via separation of threshold compensation of the drive transistor and data programming phases. The threshold compensation time is decided by the drive transistor characteristics and is difficult to reduce further without degrading the compensation accuracy. By separating the threshold compensation and data programming phases, a longer time can be allocated to threshold compensation for compensation accuracy. As referenced above, the RC constant time required for charging the programming capacitor is determinative of the programming time since data programming is performed separately for each row (whereas the compensation phase can be performed simultaneously for different rows), and such programming time can be reduced to ultra-short 1H times (<2 μs).

To achieve such results, a two-capacitor structure is used, whereby a first capacitor is used for drive transistor threshold compensation, and a second capacitor is used to store the data voltage. The threshold compensation and data programming operations are independent of each other, and thus a short one horizontal time can be achieved by employing a short data programming phase. Embodiments of the present application also use an ultra-low leakage oxide transistor, such as an indium gallium zinc oxide (IGZO) device, as the data switch device, and this permits the stored data voltage to be retained longer on the second capacitor due to the ultra-low leakage of the ultra-low leakage transistor. As a result, the refresh rate can be reduced as compared to conventional configurations, down to about 30 Hz which is particularly suitable for displaying static images.

Figure 5:
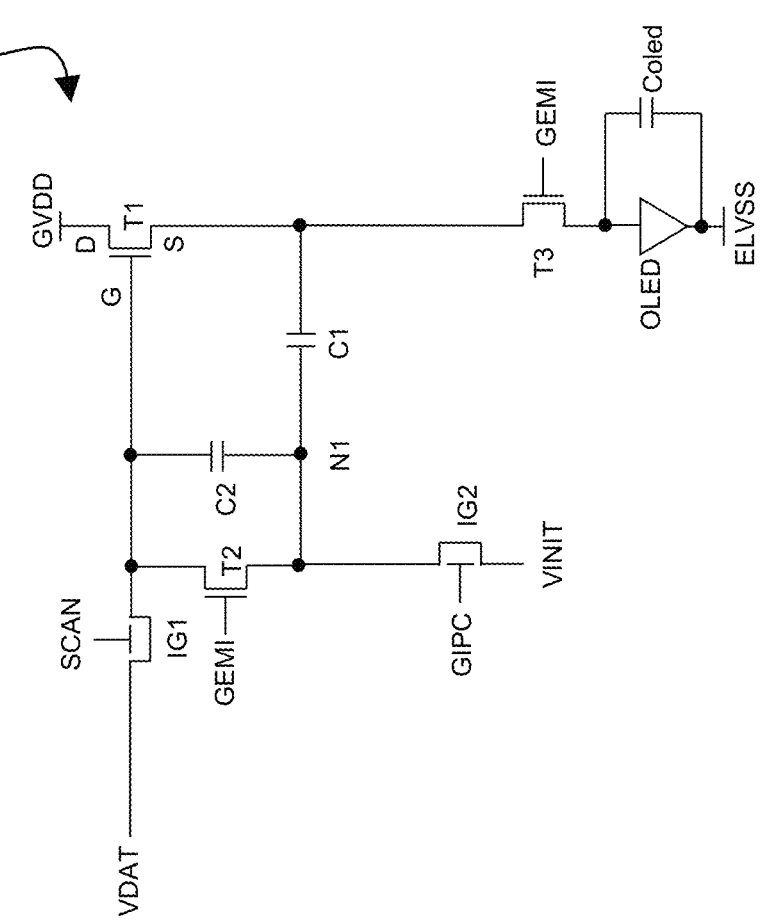
FIG. 5 is a drawing depicting a pixel circuit configuration in accordance with embodiments of the present application.
Figure 6:
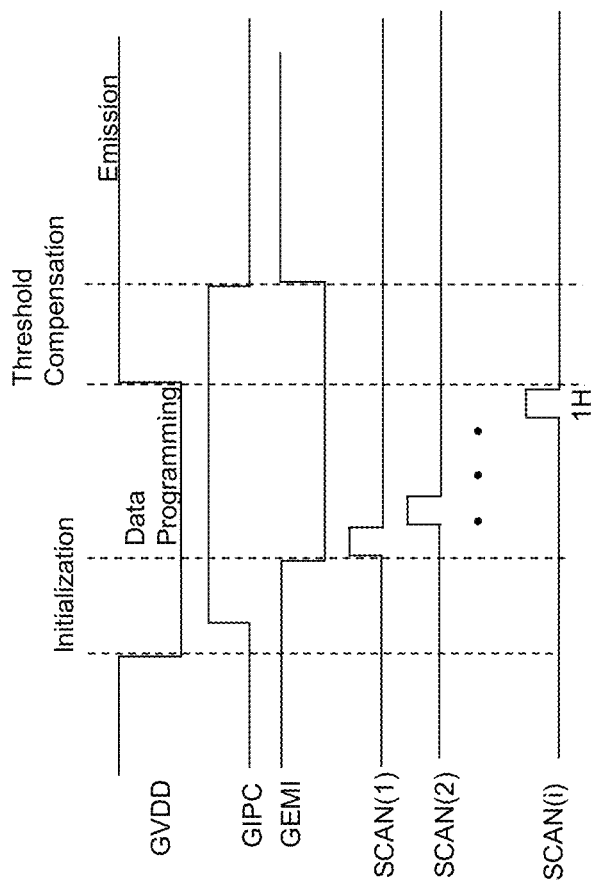
FIG. 6 is a drawing depicting a timing diagram associated with the operation of the circuit of FIG. 5.

FIG. 5 is a drawing depicting an exemplary pixel circuit configuration 30 in accordance with embodiments of the present application, and FIG. 6 is a timing diagram associated with the operation of the circuit configuration 30 of FIG. 5. In this example, the pixel circuit 30 is configured as a thin film transistor (TFT) circuit that includes three n-type transistors T1, T2, T3, two n-type ultra-low leakage transistors IG1 and IG2, which may be IGZO transistors, and two capacitors C1 and C2. In this context, an ultra-low leakage transistor is a TFT that has very low leakage current as compared to LTPS (low-temperature polycrystalline silicon) TFTs, and may experience on the order of $\frac{1}{100}^{th}$ of the leakage current at typical operating conditions. For example, with the same drain-source voltage of 5 volts, the off current for an LTPS transistor is normally approximately 1 pA (1E-12) when the device is in an off state, while an ultra-low leakage TFT has a leakage current less than approximately 0.01 pA (1E-14) when the device is in the off state.

The circuit elements drive a light-emitting device, such as for example an OLED. The light-emitting device (OLED) has an associated internal capacitance, which is represented in the circuit diagram as $C_{oled}$. In addition, although the embodiments are described principally in connection with an OLED as the light-emitting device, comparable principles may be used with display technologies that employ other types of light-emitting devices, including for example micro LEDs and quantum dot LEDs.

More specifically, FIG. 5 depicts the pixel circuit 30 configured with multiple n-type TFTs. Transistor T1 is a drive transistor that is an analogue TFT with the gate, source and drain labelled ("G", "S", and "D"), and transistors T2-T3 are digital switch TFTs. IG1 and IG2 are ultra-low leakage oxide TFTs, such as for example IGZO TFTs. As referenced above, C1 and C2 are capacitors, with C1 also being referred to as the storage capacitor and C2 also being referred to as the programming capacitor. C2 has a first plate connected to the gate of the drive transistor and a second plate connected to a first plate of C1. The second plate of C1 is connected to the source of the drive transistor. The connection of the second plate of C2 and the first plate of C1 also is referred to as the node N1. $C_{oled}$ is the internal capacitance of the OLED device (i.e., $C_{oled}$ is not a separate component, but is inherent to the OLED). The OLED further is connected to a first power supply ELVSS as is conventional.

The OLED and the TFT circuit 30, including the transistors, capacitors and connecting wires, may be fabricated using TFT fabrication processes conventional in the art. It will be appreciated that comparable fabrication processes may be employed to fabricate the TFT circuits according to any of the embodiments.

For example, the TFT circuit 30 may be disposed on a substrate such as a glass, plastic, or metal substrate. Each TFT may comprise a gate electrode, a gate insulating layer, a semiconducting layer, a first electrode, and a second electrode. The semiconducting layer is disposed on the substrate. The gate insulating layer is disposed on the semiconducting layer, and the gate electrode may be disposed on the insulating layer. The first electrode and second electrode may be disposed on the insulating layer and connected to the semiconducting layer using vias. The first electrode and second electrode respectively may commonly be referred to as the "source electrode" and "drain electrode" of the TFT. The capacitors each may comprise a first electrode, an insulating layer and a second electrode, whereby the insulating layer forms an insulating barrier between the first and second electrodes. Wiring between components in the circuit, and wiring used to introduce signals to the circuit (e.g. SCAN, GEMI, GIPC, VDAT etc.) may comprise metal lines or a doped semiconductor material. For example, metal lines may be disposed between the substrate and the gate electrode of a TFT, and connected to electrodes using vias. The semiconductor layer may be deposited by chemical vapour deposition, and metal layers may be deposited by a thermal evaporation technique.

Each IGZO transistor may include a gate electrode, a gate insulating layer, an IGZO layer, a first electrode, and a second electrode. The gate electrode is disposed on the substrate. A gate insulating layer may be disposed on the gate electrode and the substrate. An IGZO layer may be disposed on the gate insulating layer. The first electrode and second electrode may be disposed on the IGZO layer and connected to a metal layer by vias. The first electrode and second electrode respectively may commonly be referred to as the "source electrode" and "drain electrode" of the TFT. The connection between the IGZO TFT and other TFT may be through a metal layer.

The light-emitting device, such as an OLED device, may be disposed over the TFT circuit. The OLED device may include a first electrode (e.g. anode of the OLED), which is connected to transistor T3 in this example, one or more layers for injecting or transporting charge (e.g. holes) to an emission layer, an emission layer, one or more layers for injecting or transporting electrical charge (e.g. electrons) to the emission layer, and a second electrode (e.g. cathode of the OLED), which is connected to power supply ELVSS in this example. The injection layers, transport layers, and emission layer may be organic materials, the first and second electrodes may be metals, and all of these layers may be deposited by a thermal evaporation technique.

Referring to the TFT circuit 30 of FIG. 5 in combination with the timing diagram of FIG. 6, the TFT circuit 30 operates to perform in four phases: an initialization phase, a data programming phase, a threshold compensation phase during which drive transistor characteristics are compensated, and an emission phase for light emission. As referenced above, the time period for performing the programming phase is referred to in the art as the "one horizontal time" or "1H" time as illustrated in the timing diagram. A short 1H time is a requirement for displays with a large number of pixels in a column, as is necessary for high-resolution displays. As referenced above, a short one horizontal time is significant because each row must be programmed independently, whereas other operations, such as for example drive transistor threshold compensation, may be performed for multiple rows simultaneously. The responsiveness of the device, therefore, tends to be dictated most by the one horizontal time for programming.

In this embodiment, during the previous emission phase the group emission control signal GEMI has a high voltage level, so transistors T3 and T2 are on, and light emission is being driven by the group power supply voltage GVDD input line connected to the drive transistor T1, whereby the actual current applied to the OLED is determined by the voltage at the gate of the drive transistor. The SCAN signal level initially has a low voltage value so transistor IG1 is off, and the group control signal GIPC has a low voltage value so transistor IG2 is off. As IG1 and IG2 are ultra-low leakage transistors, the leakage flowing through these two transistors is very small when the transistors are off. Accordingly, there may be only a very small voltage variation at the storage capacitor C1 during the emission phase. If the display is a static image, the frame rate can be reduced without noticeable degradation to the human eye. The normal frame refresh rate of conventional display configurations is 60 Hz. With the use of an ultra-low leakage IGZO data switch transistor, the frame rate can be reduced to 30 Hz or lower. The power consumption of the display thus can be reduced with a lower refresh rate.

The group control signals, GVDD, GIPC and GEMI, are applied to the pixels in the same group rows as follows.

At the beginning of the initialization phase, the group power supply GVDD signal level is changed from a high voltage value to a low voltage value, $V_{DD\_L}$. As the gate "G" of drive transistor T1 is at a relatively high voltage at this time, T1 is kept on and the voltage level at the source "S" of the drive transistor becomes a low voltage. GEMI is at a high voltage at this time, and thus T2 and T3 are on. As transistor T3 is on, the voltage at anode of the OLED becomes a low voltage. The level of the low voltage, $V_{DD\_L}$, would be low enough to stop light emission during programming. In addition, with T2 being on, the first and second plates of C2 are electrically connected to each other. Next during the initialization phase, the group control signal GIPC changes from a low voltage value to a high voltage value causing the ultra-low leakage IGZO device, IG2, to be turned on. With IG2 being turned on, an initialization voltage, VINIT, is applied from an initialization voltage input line through IG2 to the node N1 corresponding to the connection of the second plate of C2 and the first plate of C1. With T2 also being on due to the high GEMI signal, VINIT also is applied to the gate of the drive transistor T1 through transistor T2.

At the end of the initialization phase, the group emission control signal, GEMI, level changes from a high voltage value to a low voltage value causing transistors T2 and T3 to be turned off. With transistor T2 turning off, the gate of the drive transistor is disconnected from the node N1, and the first and second plates of capacitor C2 also are disconnected from each other. With transistor T3 turning off, the source of the drive transistor and the second plate of the capacitor C1 are disconnected from the anode of the OLED. The effect of the initialization phase essentially is to clear memory effects from the previous frame.

The TFT circuit 30 next is operable in a data programming phase. A first row scan signal, SCAN(1), is changed from a low voltage value to a high voltage value, causing the ultra-low leakage IGZO transistor, IG1, to be turned on. Turning on IG1 electrically connects a data voltage input line to the programming capacitor C2 for supplying a data voltage VDAT. The data voltage VDAT thus is applied at the first plate of the storage capacitor C2 through IG1. The second plate of the programming capacitor C2 is electrically connected to the initialization voltage, VINIT through transistor IG2. The data voltage VDAT is changed from the value for the pixel of the previous row of the display, which is the last row from the previous pixel group, to the data value for the current pixel of the current row, which is applied to the programming capacitor C2. The data voltage VDAT is also applied to the gate of the drive transistor T1 through IG1. Then the first row scan signal SCAN(1) is changed from the high voltage value to the low voltage value, causing the transistor IG1 to be turned off. With IG1 turning off, the first plate of the programming capacitor C2 and the gate of the drive transistor T1 are disconnected from the data voltage input line, and the data value is stored on the programming capacitor C2. With GIPC remaining high during the data programming phase (and also during the subsequent threshold compensation phase), the initialization voltage remains applied to the node N1, which aids in isolating the data voltage VDAT on the programming capacitor C2 to separate data programming from threshold compensation.

Data programming then proceeds comparably as to all the pixels of the current pixel group. In particular, a second row scan signal, SCAN(2), is changed from the low voltage value to the high voltage value to connect the next row to the data voltage input line. The data voltage VDAT is changed from the value for the pixel of the first row to the value for the pixel of the second row in the same pixel group, which is applied to the programming capacitor C2 and the gate of the drive transistor T1 of the pixel of the second row in comparable manner as described above for the first row. Then the second row scan signal SCAN(2) is changed from the high voltage value to the low voltage value, causing the transistor IG1 of the pixel in the second row to be turned off, and the current data value is stored on the programming capacitor C2. The data programming continues to program the third row, fourth row, and so on until the last row "i" of the pixel group is programmed.

The TFT circuit 30 next is operable in a threshold compensation phase, during which the threshold voltage of the drive transistor T1 is compensated. For such phase, the group power supply GVDD signal level is changed from a low voltage value to a high voltage value. As the transistor T3 is off, the second plate of the storage capacitor C1 and the source of the drive transistor are floating and the voltage level previously has been initialized as a low voltage, $V_{DD\_L}$, during the initialization phase. As the voltage at the gate of the drive transistor is the programmed data voltage, the drive transistor is conducting, i.e., in an on state. The voltage at the second plate of the storage capacitor C1 and the source of the drive transistor is pulled up until the voltage reaches the level of $V_{DAT}-V_{TH}$, where $V_{TH}$ is the threshold voltage of the drive transistor. In this manner, the threshold voltage of the drive transistor effectively is stored on the storage capacitor C1.

Preferably, to have effective voltage threshold compensation of the drive transistor T1, the initial voltage difference between the source of the drive transistor and the voltage at the gate of the drive transistor, currently VDAT, should satisfy the following condition:

$$V_{DAT}-V_{DD\_L} > |V_{TH}| + \Delta V,$$

where ΔV is a voltage that is large enough to generate a high initial current to charge the storage capacitor within an allocated threshold compensation time. The value of ΔV will depend on the properties of the transistors. For example, ΔV would be at least 3 volts for exemplary low-temperature polycrystalline silicon thin film transistor processes. The power supply low voltage, $V_{DD\_L}$, is set to satisfy the voltage requirement.

At the end of threshold compensation phase, the group control signal, GIPC, level is changed from the high voltage to the low voltage, causing transistor IG2 to be turned off. As IG2 is turned off, the node N1 connection of the second plate of C2 and the first plate of C1 are disconnected from the initialization voltage input line that supplies VINIT. Such operation places the pixel circuit in configuration for the subsequent emission phase.

The TFT circuit 30 next is operable in an emission phase during which the OLED is capable of emitting light. The group emission signal, GEMI, is changed from the low voltage value to the high voltage value, causing transistors T2 and T3 to be turned on. As the transistor T2 is turned on, the gate of the drive transistor and the node N1 connection of the two capacitors are connected, as are the first and second plates of the capacitor C2. The charge on the capacitor C2 is thereby nulled, and the charge on the capacitor C1 is maintained. The voltage difference between the first plate and the second plate of the capacitor C1 is $$V_{INIT}-(V_{DAT}-V_{TH})$$

As transistor T3 is turned on, the source of the drive transistor is connected to anode of the OLED. The current that flows through the OLED is $$I_{OLED} = \frac{\beta}{2}(V_{INIT}-(V_{DAT}-V_{TH})-V_{TH})^2 = \frac{\beta}{2}(V_{INIT}-V_{DAT})^2$$

$$\text{where } \beta = \mu_n \cdot C_{ox} \cdot \frac{W}{L};$$

$C_{ox}$ is the capacitance of the drive transistor gate oxide;
W is the width of the drive transistor channel;
L is the length of the drive transistor channel (i.e. distance between source and drain); and
$\mu_n$ is the carrier mobility of the drive transistor.

Accordingly, the current to the OLED does not depend on the threshold voltage of the drive transistor T1, and hence the current to the OLED device $I_{OLED}$ is not affected by the threshold voltage variations of the drive transistor. In this manner, variation in the threshold voltage of the drive transistor has been compensated.

The pixel circuit 30 operated as described above has several advantages. As referenced above, the pixel circuit is capable of compensating the threshold voltage variations of the drive transistor while maintaining an ultra-short data programming one horizontal time 1H of less than about 2 μs, which is shorter as compared to conventional configurations, with additionally removing the possible memory effects associated with the OLED device and drive transistor from the previous frame. This is achieved by using the two-capacitor configuration to separate the threshold compensation and data programming phases, such that a longer time can be allocated to threshold compensation for compensation accuracy while maintaining the ultra-short 1H time. By using an ultra-low leakage transistor, such as an IGZO transistor, as the data switch transistor IG1, and also in combination with the initialization voltage switch transistor IG2, the refresh rate can be reduced to 30 Hz or lower for static images. With a lower refresh rate, the power consumption in turn is reduced.

The enhanced pixel circuit configuration also enables efficient operation within the group compensation and control scheme described above, and further power saving is achieved by the group compensation scheme. Referring to the display panel operation of FIGS. 1-4 in combination with the individual pixel circuit operation of FIG. 5-6, GVDD, GIPC, and GEMI are common group control signals that are applied to all pixel rows within a respective group simultaneously. This in particular permits the threshold compensation phase to be performed simultaneously for all pixels within a given group, as illustrated for example in the timing diagram of FIG. 4. The data programming phase includes sequentially enabling the SCAN signal to the pixel array row by row without disruption from the first row to the ith row of each group. In turn, due to the phase timing by which the data programming phase of the next group proceeds essentially upon completion of the data programming phase of the previous group, as also shown in FIG. 4, the data programming phase programs the pixel array row by row without disruption from the first row to the nth row of the display panel.

An aspect of the invention, therefore, is a pixel circuit for a display device that employs a two capacitor configuration and an ultra-low leakage data switch transistor to isolate the data programming phase from the compensation phase, thereby enable a shorter 1H time as compared to conventional configurations, and further permitting a reduced refresh rate. The pixel circuit is operable in an initialization phase, a data programming phase, a threshold compensation phase, and an emission phase.

In exemplary embodiments, the pixel circuit includes a drive transistor configured to control an amount of current to a light-emitting device during the emission phase depending upon a voltage applied to a gate of the drive transistor, wherein a threshold voltage of the drive transistor is compensated during the threshold compensation phase, and a first terminal of the drive transistor is connected to a first power supply; wherein the light-emitting device is electrically connected at a first node to a second terminal of the drive transistor during the emission phase, and at a second node to a second power supply; a first ultra-low leakage oxide transistor connected between the gate of the drive transistor and a data voltage input line that supplies a data voltage, wherein the data voltage is applied to the gate of the drive transistor through the first ultra-low leakage oxide transistor during the data programming phase; and a second ultra-low leakage oxide transistor connected between a node N1 and an initialization voltage input line that supplies an initialization voltage, the second ultra-low leakage oxide transistor being in an on state during the initialization, data programming, and threshold compensation phases, and the initialization voltage is applied to the gate of the drive transistor through the second ultra-low leakage oxide transistor during the initialization phase. The pixel circuit may include one or more of the following features, either individually or in combination.

In an exemplary embodiment of the pixel circuit, the pixel circuit further includes a first capacitor having a first plate connected to the node N1 and a second plate connected to the second terminal of the drive transistor; and a second capacitor having a first plate connected to the gate of the drive transistor and a second plate connected to the node N1, wherein the first plate of the second capacitor stores the data voltage during the data programming and threshold compensation phases.

In an exemplary embodiment of the pixel circuit, the pixel circuit further includes a second transistor connected between the gate of the drive transistor and the node N1, wherein the initialization voltage is applied to the gate of the drive transistor through the second transistor during the initialization phase.

In an exemplary embodiment of the pixel circuit, the pixel circuit further includes a third transistor connected between the second terminal of the drive transistor and the first node of the light-emitting device, wherein the first node of the light-emitting device is electrically connected to the second terminal of the drive transistor through the third transistor during the emission phase.

In an exemplary embodiment of the pixel circuit, the first and/or second ultra-low leakage oxide transistors are indium gallium zinc oxide transistors.

In an exemplary embodiment of the pixel circuit, a voltage level of the first power supply changes from a higher value to a lower value at the beginning of the initialization phase, and changes to the higher value at the end of the data programming phase.

In an exemplary embodiment of the pixel circuit, the transistors are n-type transistors.

In an exemplary embodiment of the pixel circuit, the wherein the light-emitting device is one of an organic light-emitting diode, a micro light-emitting diode (LED), or a quantum dot LED.

Another aspect of the invention is a display panel including a pixel array comprising a plurality of individual pixel circuits arranged in "n" rows by "m" columns, and "n" and "m" are integers greater than one, wherein each of the individual pixel circuits in the pixel array is configured according to any the embodiments. In exemplary embodiments of the display panel, the pixel array is arranged in "n/i" pixel groups wherein "i" is the number of rows of individual pixel circuits in each pixel group; the first power supply is a group power supply that supplies voltage to all individual pixel circuits within a respective pixel group; gates of the first ultra-low leakage oxide transistor of each of the rows of individual pixel circuits are connected to a row SCAN control signal line that supplies a SCAN control signal that controls a state of the first ultra-low leakage oxide transistors in a corresponding row; and gates of the second ultra-low leakage oxide transistors in each pixel group are connected to a common group control signal line that supplies a common group control signal GIPC that controls a state of the second ultra-low leakage oxide transistors of the respective group. The display panel may include one or more of the following features, either individually or in combination.

In an exemplary embodiment of the display panel, each of the individual pixel circuits further comprises a second transistor connected between the gate of the drive transistor and the node N1, and gates of the second transistors in each pixel group are connected to a common group emission control signal line that supplies a common group emission control signal GEMI that controls a state of the second transistors of the respective group; each of the individual pixel circuits further comprises a third transistor connected between the second terminal of the drive transistor and the first node of the light-emitting device, and gates of the third transistors in each pixel group are connected to the common group emission control signal GEMI that controls a state of the third transistors of the respective group; and the common group emission control signal GEMI turns off the second and third transistors during the data programming and threshold compensation phases, and turns on the second and third transistors during the initialization and emission phases.

In an exemplary embodiment of the display panel, the display panel further includes a first clock input line that supplies a first clock signal that controls the SCAN control signals, and a second clock signal input line that supplies a second clock signal that controls the group GIPC, GEMI, and group power supply control signals, wherein a frequency of the second clock signal is one "i" th of a frequency of the first clock signal.

In an exemplary embodiment of the display panel, a voltage level of the group power supply changes from a higher value to a lower value at beginning of the initialization phase and changes to the higher level at the end of the data programming phase.

Another aspect of the invention is a method of operating a pixel circuit according to any of the embodiments, whereby component variations are compensated within a short 1H time. In exemplary embodiments, the method of operating includes the steps of providing a pixel circuit according to any of the embodiments; performing an initialization phase comprising: changing a voltage level of the first power supply from a higher value to a lower value at the beginning of the initialization phase to initialize a voltage level at the second terminal of the drive transistor and the first node of the light-emitting device, placing the second ultra-low leakage oxide transistor in an on state to apply an initialization voltage to the gate of the drive transistor through the second ultra-low leakage oxide transistor, and at the end of the initialization phase, disconnecting the source of the drive transistor from the first node of the light-emitting device; performing a data programming phase to program the data voltage by electrically connecting the data voltage input line to the gate of the drive transistor through the first ultra-low leakage oxide transistor, and applying the data voltage to the gate of the drive transistor; performing a threshold compensation phase to compensate a threshold voltage of the drive transistor by changing the first power supply from the lower value to the higher value while the second ultra-low leakage oxide transistor is in the on state; and performing an emission phase during which light is emitted from the light-emitting device by electrically connecting the second terminal of the drive transistor to the first node of the light emitting device while the first and second ultra-low leakage oxide transistors are in the off state. The method of operating may include one or more of the following features, either individually or in combination.

In an exemplary embodiment of the method of operating, the individual pixel circuit further comprises a first capacitor having a first plate connected to the node N1 and a second plate connected to the second terminal of the drive transistor, and a second capacitor having a first plate connected to the gate of the drive transistor and a second plate connected to the node N1, and the first plate of the second capacitor stores the data voltage during the data programming and threshold compensation phases.

In an exemplary embodiment of the method of operating, the individual pixel circuit further comprises a second transistor connected between the gate of the drive transistor and the node N1, and the initialization voltage is applied to the gate of the drive transistor through the second transistor during the initialization phase.

In an exemplary embodiment of the method of operating, the first and second plates of the second capacitor are electrically connected to each other through the second transistor at the beginning of the initialization phase and during the emission phase.

In an exemplary embodiment of the method of operating, at the end of the initialization phase, the first plate and the second plate of the second capacitor are disconnected from each other by turning off the second transistor.

In an exemplary embodiment of the method of operating, the individual pixel circuit further comprises a third transistor connected between the second terminal of the drive transistor and the first node of the light-emitting device, and during the emission phase the first node of the light-emitting device is electrically connected to the second terminal of the drive transistor through the third transistor.

In an exemplary embodiment of the method of operating, the method further includes arranging a plurality of individual pixel circuits in a pixel array of "n" rows by "m" columns wherein "n" and "m" are integers greater than one; and grouping the individual pixel circuits of the pixel array in "n/i" pixel groups wherein "i" is the number of rows of pixels in each group; wherein: the first power supply is a group power supply that supplies voltage to all pixels within a respective group, and a voltage level of the group power supply changes from the higher value to the lower value at beginning of the initialization phase and changes to the higher value at the end of the data programming phase; gates of the first ultra-low leakage oxide transistor of each of the rows of individual pixel circuits are connected to a row SCAN control signal line that supplies a SCAN control signal that controls a state of the first ultra-low leakage oxide transistors in a corresponding row, wherein the data programming phase includes sequentially enabling the SCAN signal to the pixel array row by row without disruption from the first row to the nth row; and gates of the second ultra-low leakage oxide transistors in each pixel group are connected to a common group control signal GIPC that controls a state of the second ultra-low leakage oxide transistors of the respective group to apply the initialization voltage.

In an exemplary embodiment of the method of operating, each of the individual pixel circuits further comprises a second transistor connected between the gate of the drive transistor and the node N1, and gates of the second transistors in each pixel group are connected to a common group emission control signal GEMI that controls a state of the second transistors of the respective group; each of the individual pixel circuits further comprises a third transistor connected between the second terminal of the drive transistor and the first node of the light-emitting device, and gates of the third transistors in each pixel group are connected to the common group emission control signal GEMI that controls a state of the third transistors of the respective group; and the common group emission control signal GEMI turns off the second and third transistors during the data programming and threshold compensation phases, and turns on the second and third transistors during the initialization and emission phases.

Although the invention has been shown and described with respect to a certain embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

INDUSTRIAL APPLICABILITY

Embodiments of the present invention are applicable to many display devices to permit display devices of high resolution with effective threshold voltage compensation and true black performance. Examples of such devices include televisions, mobile phones, personal digital assistants (PDAs), tablet and laptop computers, desktop monitors, digital cameras, and like devices for which a high resolution display is desirable.

REFERENCE SIGNS LIST

10—display panel configuration
12—pixel array
14—individual pixels

16—first panel driver
18—second panel driver
20—first group of pixel rows
22—second group of pixel rows
24—"n/i" th group of pixel rows
30—pixel circuit configuration
T1-T3—multiple transistors
IG1-IG2—multiple ultra-low leakage oxide transistors
OLED—organic light emitting diode (or generally light-emitting device)
C1—storage capacitor
C2—programming capacitor
$C_{oled}$—internal capacitance of OLED
VDAT—data voltage
GVDD—group power supply
ELVSS—power supply
VINIT—initialization voltage supply
SCAN—row control signals
GIPC/GEMI—group control signals

What is claimed is:

1. A pixel circuit for a display device operable in an initialization phase, a data programming phase, a threshold compensation phase, and an emission phase, the pixel circuit comprising:
a drive transistor configured to control an amount of current to a light-emitting device during the emission phase depending upon a voltage applied to a gate of the drive transistor, wherein a threshold voltage of the drive transistor is compensated during the threshold compensation phase, and a first terminal of the drive transistor is connected to a first power supply;
wherein the light-emitting device is electrically connected at a first node to a second terminal of the drive transistor during the emission phase, and at a second node to a second power supply;
a first ultra-low leakage oxide transistor connected between the gate of the drive transistor and a data voltage input line that supplies a data voltage, wherein the data voltage is applied to the gate of the drive transistor through the first ultra-low leakage oxide transistor during the data programming phase; and
a second ultra-low leakage oxide transistor connected between a node N1 and an initialization voltage input line that supplies an initialization voltage, the second ultra-low leakage oxide transistor being in an on state during the initialization, data programming, and threshold compensation phases, and the initialization voltage is applied to the gate of the drive transistor through the second ultra-low leakage oxide transistor during the initialization phase.

2. The pixel circuit of claim 1, further comprising a first capacitor having a first plate connected to the node N1 and a second plate connected to the second terminal of the drive transistor; and
a second capacitor having a first plate connected to the gate of the drive transistor and a second plate connected to the node N1, wherein the first plate of the second capacitor stores the data voltage during the data programming and threshold compensation phases.

3. The pixel circuit of claim 1, further comprising a second transistor connected between the gate of the drive transistor and the node N1, wherein the initialization voltage is applied to the gate of the drive transistor through the second transistor during the initialization phase.

4. The pixel circuit of claim 3, further comprising a third transistor connected between the second terminal of the drive transistor and the first node of the light-emitting device, wherein the first node of the light-emitting device is electrically connected to the second terminal of the drive transistor through the third transistor during the emission phase.

5. The pixel circuit of claim 1, wherein the first and/or second ultra-low leakage oxide transistors are indium gallium zinc oxide transistors.

6. The pixel circuit of claim 1, wherein a voltage level of the first power supply changes from a higher value to a lower value at the beginning of the initialization phase, and changes to the higher value at the end of the data programming phase.

7. The pixel circuit of claim 1, wherein the transistors are n-type transistors.

8. The pixel circuit of claim 1, wherein the wherein the light-emitting device is one of an organic light-emitting diode, a micro light-emitting diode (LED), or a quantum dot LED.

9. A display panel comprising:
a pixel array comprising a plurality of individual pixel circuits arranged in "n" rows by "m" columns, and "n" and "m" are integers greater than one; wherein:
each of the individual pixel circuits in the pixel array is configured according to claim 1;
the pixel array is arranged in "n/i" pixel groups wherein "i" is the number of rows of individual pixel circuits in each pixel group;
the first power supply is a group power supply that supplies voltage to all individual pixel circuits within a respective pixel group;
gates of the first ultra-low leakage oxide transistor of each of the rows of individual pixel circuits are connected to a row SCAN control signal line that supplies a SCAN control signal that controls a state of the first ultra-low leakage oxide transistors in a corresponding row; and
gates of the second ultra-low leakage oxide transistors in each pixel group are connected to a common group control signal line that supplies a common group control signal GIPC that controls a state of the second ultra-low leakage oxide transistors of the respective group.

10. The display panel of claim 9, wherein:
each of the individual pixel circuits further comprises a second transistor connected between the gate of the drive transistor and the node N1, and gates of the second transistors in each pixel group are connected to a common group emission control signal line that supplies a common group emission control signal GEMI that controls a state of the second transistors of the respective group;
each of the individual pixel circuits further comprises a third transistor connected between the second terminal of the drive transistor and the first node of the light-emitting device, and gates of the third transistors in each pixel group are connected to the common group emission control signal GEMI that controls a state of the third transistors of the respective group; and
the common group emission control signal GEMI turns off the second and third transistors during the data programming and threshold compensation phases, and turns on the second and third transistors during the initialization and emission phases.

11. The display panel of claim 10, further comprising a first clock input line that supplies a first clock signal that controls the SCAN control signals, and a second clock signal input line that supplies a second clock signal that controls the group GIPC, GEMI, and group power supply control signals, wherein a frequency of the second clock signal is one "i" th of a frequency of the first clock signal.

12. The display panel of claim 9, wherein a voltage level of the group power supply changes from a higher value to a lower value at beginning of the initialization phase and changes to the higher level at the end of the data programming phase.

13. A method of operating a display panel comprising the steps of:
    providing an individual pixel circuit comprising:
        a drive transistor configured to control an amount of current to a light-emitting device during an emission phase depending upon a voltage applied to a gate of the drive transistor, and a first terminal of the drive transistor is connected to a first power supply;
        wherein the light-emitting device is electrically connected at a first node to a second terminal of the drive transistor during the emission phase, and at a second node to a second power supply;
        a first ultra-low leakage oxide transistor connected between the gate of the drive transistor and a data voltage input line that supplies a data voltage; and
        a second ultra-low leakage oxide transistor connected between a node N1 and an initialization voltage input line that supplies an initialization voltage;
    performing an initialization phase comprising:
        changing a voltage level of the first power supply from a higher value to a lower value at the beginning of the initialization phase to initialize a voltage level at the second terminal of the drive transistor and the first node of the light-emitting device;
        placing the second ultra-low leakage oxide transistor in an on state to apply an initialization voltage to the gate of the drive transistor through the second ultra-low leakage oxide transistor; and
        at the end of the initialization phase, disconnecting the source of the drive transistor from the first node of the light-emitting device;
    performing a data programming phase to program the data voltage by electrically connecting the data voltage input line to the gate of the drive transistor through the first ultra-low leakage oxide transistor, and applying the data voltage to the gate of the drive transistor;
    performing a threshold compensation phase to compensate a threshold voltage of the drive transistor by changing the first power supply from the lower value to the higher value while the second ultra-low leakage oxide transistor is in the on state; and
    performing an emission phase during which light is emitted from the light-emitting device by electrically connecting the second terminal of the drive transistor to the first node of the light emitting device while the first and second ultra-low leakage oxide transistors are in the off state.

14. The method of operating of claim 13, wherein:
    the individual pixel circuit further comprises a first capacitor having a first plate connected to the node N1 and a second plate connected to the second terminal of the drive transistor, and a second capacitor having a first plate connected to the gate of the drive transistor and a second plate connected to the node N1, and
    the first plate of the second capacitor stores the data voltage during the data programming and threshold compensation phases.

15. The method of operating of claim 14, wherein the individual pixel circuit further comprises a second transistor connected between the gate of the drive transistor and the node N1, and the initialization voltage is applied to the gate of the drive transistor through the second transistor during the initialization phase.

16. The method of operating of claim 15, wherein the first and second plates of the second capacitor are electrically connected to each other through the second transistor at the beginning of the initialization phase and during the emission phase.

17. The method of operating of claim 16, wherein at the end of the initialization phase, the first plate and the second plate of the second capacitor are disconnected from each other by turning off the second transistor.

18. The method of operating of claim 13, wherein the individual pixel circuit further comprises a third transistor connected between the second terminal of the drive transistor and the first node of the light-emitting device, and during the emission phase the first node of the light-emitting device is electrically connected to the second terminal of the drive transistor through the third transistor.

19. The method of operating of claim 13, further comprising:
    arranging a plurality of individual pixel circuits in a pixel array of "n" rows by "m" columns wherein "n" and "m" are integers greater than one; and
    grouping the individual pixel circuits of the pixel array in "n/i" pixel groups wherein "i" is the number of rows of pixels in each group;
    wherein:
    the first power supply is a group power supply that supplies voltage to all pixels within a respective group, and a voltage level of the group power supply changes from the higher value to the lower value at beginning of the initialization phase and changes to the higher value at the end of the data programming phase;
    gates of the first ultra-low leakage oxide transistor of each of the rows of individual pixel circuits are connected to a row SCAN control signal line that supplies a SCAN control signal that controls a state of the first ultra-low leakage oxide transistors in a corresponding row, wherein the data programming phase includes sequentially enabling the SCAN signal to the pixel array row by row without disruption from the first row to the nth row; and
    gates of the second ultra-low leakage oxide transistors in each pixel group are connected to a common group control signal GIPC that controls a state of the second ultra-low leakage oxide transistors of the respective group to apply the initialization voltage.

20. The method of operating of claim 19, wherein:
    each of the individual pixel circuits further comprises a second transistor connected between the gate of the drive transistor and the node N1, and gates of the second transistors in each pixel group are connected to a common group emission control signal GEMI that controls a state of the second transistors of the respective group;
    each of the individual pixel circuits further comprises a third transistor connected between the second terminal of the drive transistor and the first node of the light-emitting device, and gates of the third transistors in each pixel group are connected to the common group emission control signal GEMI that controls a state of the third transistors of the respective group; and
    the common group emission control signal GEMI turns off the second and third transistors during the data programming and threshold compensation phases, and turns on the second and third transistors during the initialization and emission phases.

* * * * *